US010558606B1

(12) United States Patent
Das et al.

(10) Patent No.: US 10,558,606 B1
(45) Date of Patent: Feb. 11, 2020

(54) RELIABLE VOLTAGE SCALED LINKS FOR COMPRESSED DATA

(71) Applicant: Advanced Micro Devices, Inc., Santa Clara, CA (US)

(72) Inventors: Shomit N. Das, Austin, TX (US); Matthew Tomei, Champaign, IL (US); Shrikanth Ganapathy, Mountain View, CA (US); John Kalamatianos, Arlington, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/118,172

(22) Filed: Aug. 30, 2018

(51) Int. Cl.
*G06F 13/42* (2006.01)
*G06F 1/3296* (2019.01)
*H03M 13/05* (2006.01)

(52) U.S. Cl.
CPC ............ *G06F 13/42* (2013.01); *G06F 1/3296* (2013.01); *H03M 13/05* (2013.01)

(58) Field of Classification Search
CPC .... G06F 3/0625; G06F 3/0653; G06F 3/0673; G06F 3/0661; G06F 3/0635; G06F 13/4068; G06F 11/002; G06F 11/08; G06F 1/3253; H04L 29/0604
See application file for complete search history.

(56) References Cited

U.S. PATENT DOCUMENTS

| 7,581,154 | B2* | 8/2009 | Rai ...................... G11C 11/417 |
| | | | 714/758 |
| 2017/0083262 | A1* | 3/2017 | Gadelrab .............. G06F 3/0613 |

OTHER PUBLICATIONS

Li Shang et al.; Dynamic Voltage Scaling with Links for Power Optimization of Interconnection Networks; 2002; IEEE; pp. 1-12 (Year: 2002).*

* cited by examiner

*Primary Examiner* — Idriss N Alrobaye
*Assistant Examiner* — Richard B Franklin
(74) *Attorney, Agent, or Firm* — Meyertons Hood Kivlin Kowert and Goetzel PC; Rory D. Rankin

(57) ABSTRACT

Systems, apparatuses, and methods for reliably transmitting data over voltage scaled links are disclosed. A computing system includes at least first and second devices connected via a link. In one implementation, if a data block can be compressed to less than or equal to half the original size of the data block, then the data block is compressed and sent on the link in a single clock cycle rather than two clock cycles. If the data block cannot be compressed to half the original size, but if the data block can be compressed enough to include error correction code (ECC) bits without exceeding the original size, then ECC bits are added to the compressed block which is sent on the link at a reduced voltage. The ECC bits help to correct for any errors that are generated as a result of operating the link at the reduced voltage.

20 Claims, 6 Drawing Sheets

US 10,558,606 B1

RELIABLE VOLTAGE SCALED LINKS FOR COMPRESSED DATA

This invention was made with Government support under the PathForward Project with Lawrence Livermore National Security, Prime Contract No. DE-AC52-07NA27344, Subcontract No. B620717 awarded by the United States Department of Energy. The United States Government has certain rights in this invention.

BACKGROUND

Description of the Related Art

Modern processors include a variety of circuits and components to facilitate fast and efficient computation. In addition, circuits and components are included to manage communications between devices. For example, processors frequently communicate with devices such as display devices, external storage devices, network communications, as well as various other peripheral devices. In order to communicate with these devices, transactions are conveyed from, and received by, processing elements within various types of processors (e.g., central processing units, graphics processing units, etc.). Data movement energy is a big component of the total chip energy during program execution.

One technique for decreasing data movement energy is to lower the voltage on the physical wires carrying the data. When data is transferred at a reduced voltage, less power is consumed and consequently energy consumption is reduced. The tradeoff is that when the voltage is lowered on the physical wires carrying the data, the data reliability decreases. In other words, assuming the operating frequency remains the same, the bit error rate increases for data sent over a link as the supply voltage to the link is reduced.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, and methods for reliably transmitting data over voltage scaled links are disclosed herein. A computing system includes at least a first device with a control unit, a second device, and a link between the first and second devices. When the control unit receives an indication that a block of data will be transferred to the second device, the control unit determines if the block of data can be compressed to a size less than or equal to a first threshold. In one implementation, the first threshold is equal to half of the size of the original block of data. In other implementations, the first threshold is equal to other values.

If the block of data cannot be compressed to a size less than or equal to the first threshold, the control unit determines if the block of data can be compressed to a size less than or equal to a second threshold. If the block of data can be compressed to a size less than or equal to the second threshold but not less than or equal to the first threshold, the control unit reduces a voltage supplied to the link, generates a compressed version of the block of data, generates error correction code (ECC) data from the compressed version of the block of data, and transfers the compressed version of the block of data and the ECC data to the second device on the link using a reduced voltage. By reducing the voltage supplied to the link, energy consumption is decreased while the ECC data helps to mitigate the reduction in data reliability caused by lowering the voltage on the link.

Figure 1:
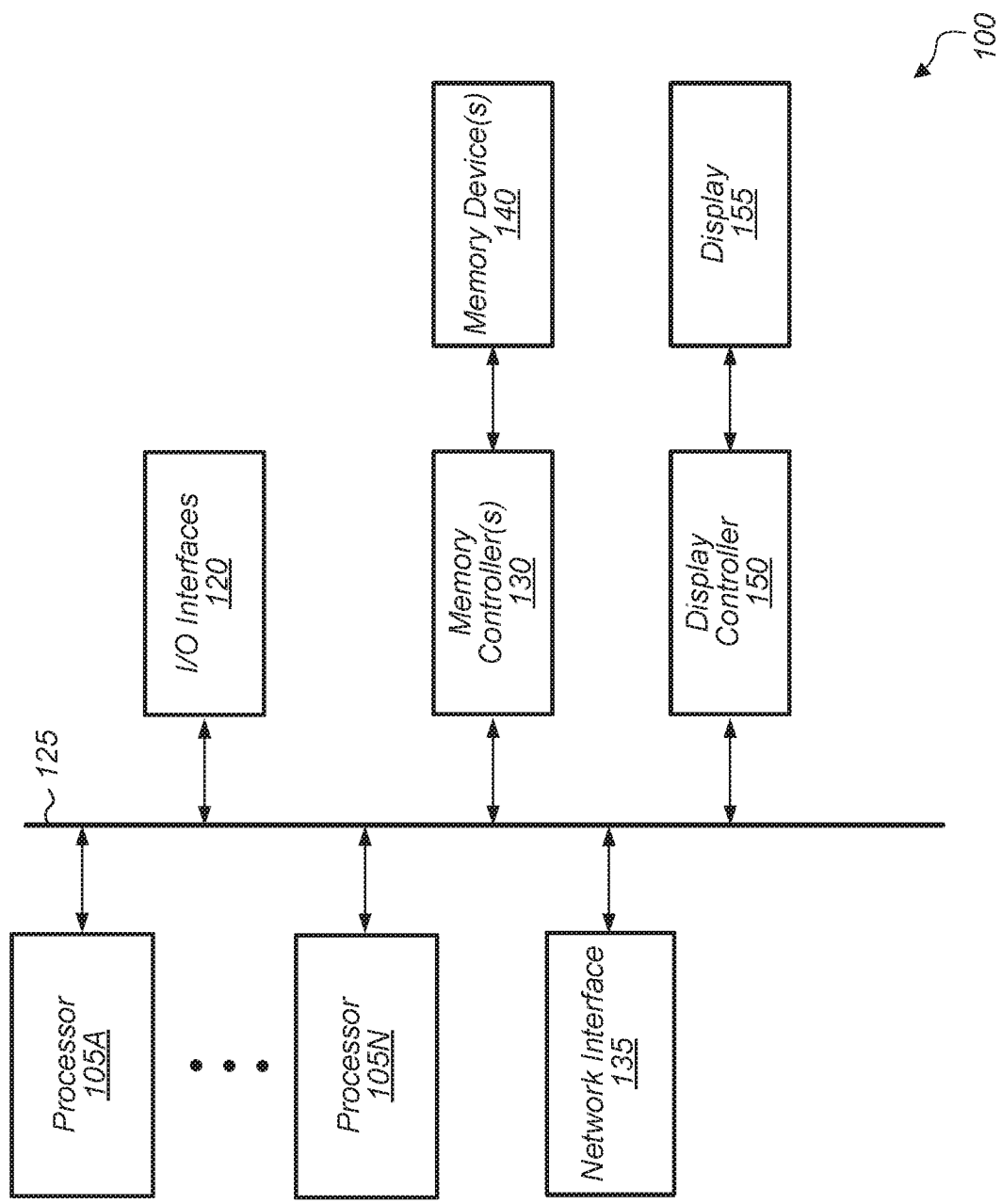
FIG. 1 is a block diagram of one implementation of a computing system.

Referring now to FIG. 1, a block diagram of one implementation of a computing system 100 is shown. In one implementation, computing system 100 includes at least processors 105A-N, input/output (I/O) interfaces 120, bus 125, memory controller(s) 130, network interface 135, memory device(s) 140, display controller 150, and display 155. In other implementations, computing system 100 includes other components and/or computing system 100 is arranged differently. Processors 105A-N are representative of any number of processors which are included in system 100.

In one implementation, processor 105A is a general purpose processor, such as a central processing unit (CPU). In one implementation, processor 105N is a data parallel processor with a highly parallel architecture. Data parallel processors include graphics processing units (GPUs), digital signal processors (DSPs), field programmable gate arrays (FPGAs), application specific integrated circuits (ASICs), and so forth. In some implementations, processors 105A-N include multiple data parallel processors. In one implementation, processor 105N is a GPU which provides pixels to display controller 150 to be driven to display 155.

Memory controller(s) 130 are representative of any number and type of memory controllers accessible by processors 105A-N. Memory controller(s) 130 are coupled to any number and type of memory devices(s) 140. Memory device (s) 140 are representative of any number and type of memory devices. For example, the type of memory in memory device(s) 140 includes Dynamic Random Access Memory (DRAM), Static Random Access Memory (SRAM), NAND Flash memory, NOR flash memory, Ferroelectric Random Access Memory (FeRAM), or others.

I/O interfaces 120 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral devices (not shown) are coupled to I/O interfaces 120. Such peripheral devices include (but are not limited to) displays, keyboards, mice, printers, scanners, joysticks or other types of game controllers, media recording devices, external storage devices, network interface cards, and so forth. Network interface 135 is used to receive and send network messages across a network.

System 100 includes various numbers of communication links for transferring data between devices. Prior to a first device sending data over a given link to a second device, the first device determines how much the block of data is able to be compressed. If compression can result in one or more cycles being saved when sending the block of data, then the first device compresses the data and sends the compressed data to the second device in one or more fewer cycles. For example, if the bus width of the given link is 32 bytes and the block of data is 64 bytes, and if the block of data is able to be compressed to 32 or fewer bytes, then the compressed block of data can be sent in one cycle rather than two. However, if the block of data is not able to be compressed to 32 or fewer bytes, but the block of data can be compressed to 56 or fewer bytes, then even though a clock cycle cannot be saved, error correction code (ECC) bits can be added to the compressed data without exceeding the original size of 64 bytes. In this case, the voltage on the given link is reduced during the two cycles used to transmit the compressed block of data, resulting in a decrease in power consumption. The ECC bits will help to correct for any errors encountered during reconstruction of the block of data. In other implementations, other sizes of data blocks and bus widths will be used, and determinations about when to compress, add ECC bits, and/or reduce link voltage can be adjusted according to the individual cases.

In various implementations, computing system 100 is a computer, laptop, mobile device, game console, server, streaming device, wearable device, or any of various other types of computing systems or devices. It is noted that the number of components of computing system 100 varies from implementation to implementation. For example, in other implementations, there are more or fewer of each component than the number shown in FIG. 1. It is also noted that in other implementations, computing system 100 includes other components not shown in FIG. 1. Additionally, in other implementations, computing system 100 is structured in other ways than shown in FIG. 1.

Figure 2:
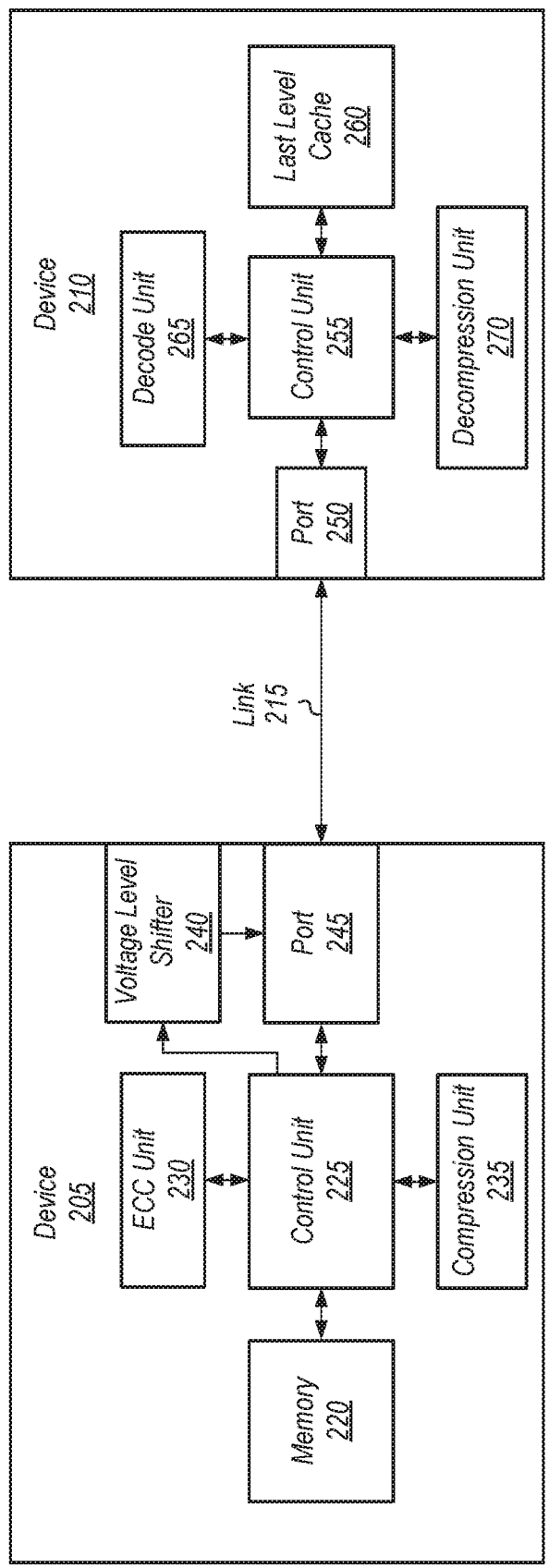
FIG. 2 is a block diagram of one implementation of devices connected by link.

Turning now to FIG. 2, a block diagram illustrating one implementation of devices 205 and 210 connected by link 215. In one implementation, devices 205 and 210 are located in system 100 (of FIG. 1). For example, in various implementations, devices 205 and 210 are separate processors 105A-N, devices 205 and 210 are located within the same processor 105A-N, devices 205 and 210 are connected via bus 125, or devices 205 and 210 are located elsewhere in system 100. Alternatively, in another implementation, devices 205 and 210 are part of a system that includes other components and/or is structured in a different manner than system 100. As shown in FIG. 2, devices 205 and 210 are connected together via link 215. Link 215 is representative of any of various types of interconnection circuitry which varies according to the implementation. In various implementations, link 215 is a fabric, bus, interconnect, crossbar, or other type of interconnection circuit.

As shown, device 205 includes at least memory 220, control unit 225, error correction code (ECC) unit 230, compression unit 235, voltage level shifter 240, and port 245. While some units are shown as separate modules, it should be understood that in other implementations, some of the units are combined together into a single module. For example, in another implementation, control unit 225, ECC unit 230, and compression unit 235 are combined into a single unit. It should also be understood that in other implementations, device 205 includes other components and/or device 205 is structured in other manners.

Memory 220 is representative of any number and type of memory devices. Control unit 225 is coupled to memory 220 and control unit 225 receives data from memory 220 to be transferred on link 215 via port 245. In one implementation, control unit 225 receives a cache line from memory 220 to be transferred on link 215. In other implementations, control unit 225 receives other amounts of data from memory 220 to be transferred on link 215. In various implementations, control unit 225 is implemented using any suitable combination of hardware and/or software.

In one implementation, when control unit 225 receives a block of data for transfer, control unit 225 uses compression unit 235 to determine how much compression can be achieved for the block of data. In one implementation, if the block of data can be compressed to exactly half of its original size or within some threshold of half of its original size, then compression unit 235 compresses the block of data and control unit 225 sends the compressed block of data on link 215 in half the number of clock cycles as would normally be used for the original block of data. In this case, voltage level shifter 240 maintains a relatively high voltage on the lanes of link 215 when the compressed block of data is sent over link 215.

However, if the block of data is not able to be compressed to half of its original size, but the block of data can be compressed enough to add ECC bits to the block of data, then compression unit 235 compresses the block of data. This is in contrast to prior art schemes which only compress the block of data if compression can reduce the block to half of its original size (or another amount which results in a decrease in the number of cycles needed to transfer the block across link 215). Next, ECC unit 230 generates ECC bits for the compressed block of data. The extra savings from compression are used to offset the use of the ECC bits. Then, control unit 225 programs voltage level shifter 240 to reduce the voltage supplied to the circuitry of port 245 and the lanes of link 215. The reduction of the voltage supplied to the circuitry of port 245 and the lanes of link 215 can result in an increase in the bit error rate of the data sent on link 215. However, the ECC bits will help device 210 to correct for errors that are generated during transmission of the data. After voltage level shifter reduces the voltage supplied to the circuitry of port 245 and the lanes of link 215, control unit 225 sends the compressed block of data plus extra ECC bits to device 210 via link 215.

In one implementation, if the block of data can be compressed to less than half of its original size while also allowing space for ECC bits, then control unit 225 uses a third type of scheme to transfer the block of data. In other words, if the combination of the compressed block of data and the extra ECC bits is less than or equal to half of the original size of the block of data, then control unit 225 uses the third type of scheme. The third type of scheme involves compression unit 235 compressing the block of data, ECC unit 230 generating ECC bits for the compressed block of data, voltage level shifter 240 reducing the voltage supplied to the circuitry of port 245 and lanes of link 215, and then control unit 225 sending the combination of the compressed block of data and ECC bits over link 215 in half the number of cycles as it would take for the original block of data.

Device 210 receives, via port 250, the data and optional ECC bits that are sent over link 215. Port 250 is coupled to link 215, and control unit 255 is coupled to port 250 to receive incoming blocks of data. If a block of data is compressed, control unit 255 activates decompression unit 270 to decompress the block of data in a lossless manner. If a block of data includes ECC bits, then control unit 255 activates decode unit 265 to reconstruct the original block of data by using the ECC bits to correct any detected errors in the received block of data. Control unit 255 stores the reconstructed block of data in last level cache 260 and/or conveys the reconstructed block of data to another device or location.

Figure 3:
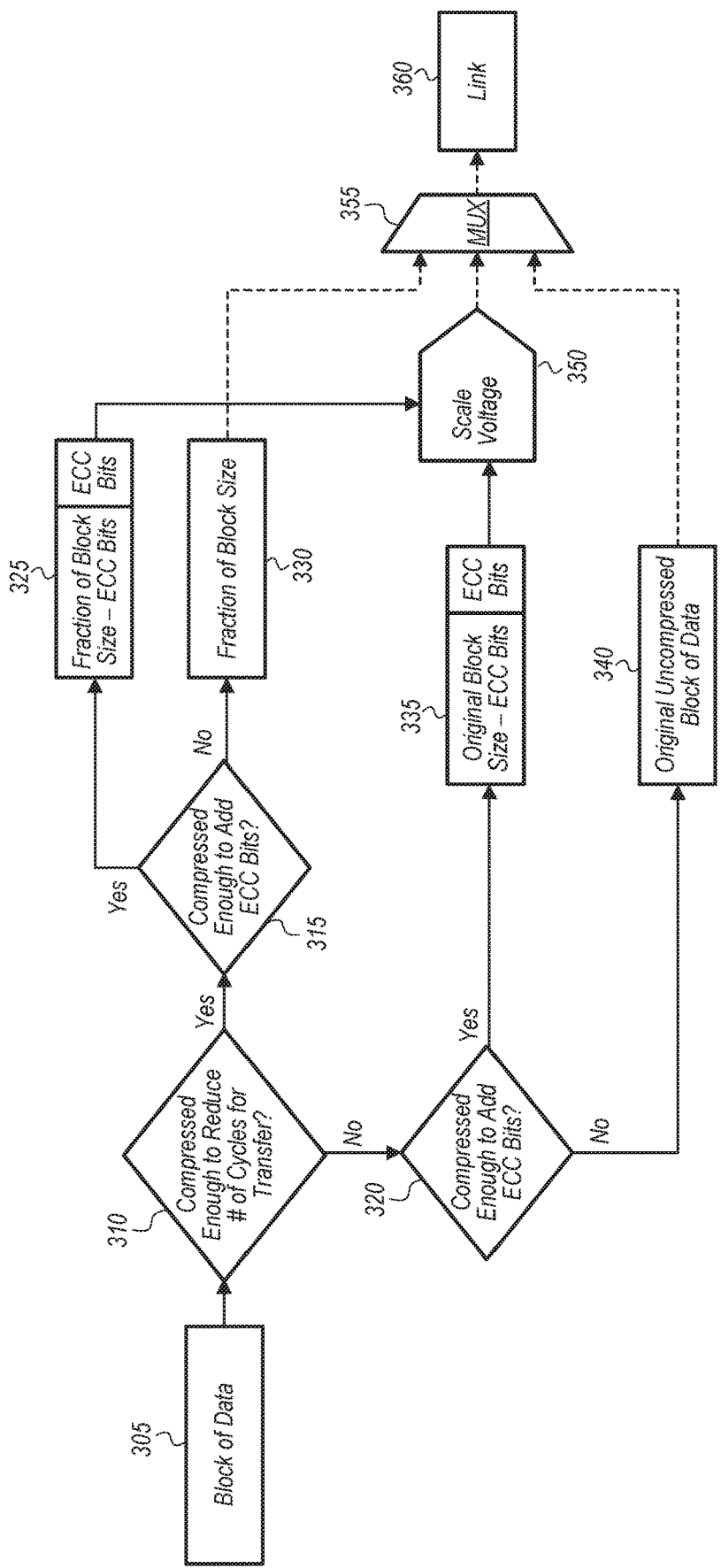
FIG. 3 is a flow diagram illustrating one implementation of preparing a block of data for transfer.

Referring now to FIG. 3, a flow diagram illustrating one implementation of preparing a block of data 305 for transfer is shown. In one implementation, a request to transfer block of data 305 is detected. In one implementation, in response to detecting the request, a control unit (e.g., control unit 225 of FIG. 2) determines the compressibility of block of data 305. In other words, the control unit determines how much savings can be achieved by compressing block of data 305. Then, the control unit compares the size of the compressed block of data to multiple values. In conditional block 310, the control unit determines if the block of data 305 is able to be compressed enough to reduce the number of cycles needed to transfer the block of data over a link 360. For example, if the size of block of data 305 is 64 bytes, and the link 360 over which block of data 305 will be sent has a width of 32 bytes, then if the compression of block of data 305 is able to reduce the size to less than or equal to 32 bytes, then the number of cycles is reduced by one. In another example, if the size of block of data 305 is 16 bytes, and the link 360 over which block of data 305 will be sent has a width of 2 bytes, then if the compression of block of data 305 is able to reduce the size to less than or equal to 14 bytes, then the number of cycles is reduced by one. In this case, potentially more than one cycle can be saved if the 16 bytes can be reduced down to 12 bytes (2 cycles saved), 10 bytes (3 cycles saved), and so on.

If the block of data 305 is able to be compressed enough to reduce the number of cycles needed to transfer the block of data over the link 360 (conditional block 310, "yes" leg), then the control unit determines if it would be possible to add ECC bits to the compressed block of data without consuming another cycle for the link transfer (conditional block 315). If the block of data 305 is unable to be compressed enough to reduce the number of cycles needed to transfer the block of data over the link 360 (conditional block 310, "no" leg), then the control unit determines if there is enough room to add ECC bits to the compressed block of data without consuming another cycle for the link transfer (conditional block 320).

On the compression path where at least one cycle of transfer over the link 360 has already been saved, if it possible to add ECC bits to the compressed data and still fit into the reduced number of transfer cycles (conditional block 315, "yes" leg), then ECC bits are generated and included with the compressed data (block 325). In this case, the compressed data is a fraction of the original block size. Since ECC bits are added to the compressed data, the link voltage is scaled (i.e., reduced) (block 350) when transferring this data on the link 360. On the other hand, if adding ECC bits to the compressed data will cause an increase in the number of link transfer cycles (as compared to sending just the compressed data) (conditional block 315, "no" leg), then ECC bits are not added to the compressed data (block 330). Since ECC bits are not included with the compressed data, the link voltage will remain at the normal, non-reduced level when the compressed data is transferred over link 360.

On the no path out of conditional block 310, if there is still enough savings from compression to add ECC bits (conditional block 320, "yes" leg), then ECC bits are added to the compressed data, with the combination still able to fit within the original block size (block 335). In this case, since ECC bits are added to the compressed data, the link voltage is reduced (block 350). However, if there is not enough savings from compression to add ECC bits (conditional block 320, "no" leg), then the original uncompressed block of data is sent on the link 360 (block 340) at the non-reduced voltage level. The data from the various cases is coupled to the inputs of multiplexer (mux) 355. The select signal for mux 355 is generated based on the results of conditional blocks 310, 315, and 320, and the output of mux 355 connects to link 360.

Figure 4:
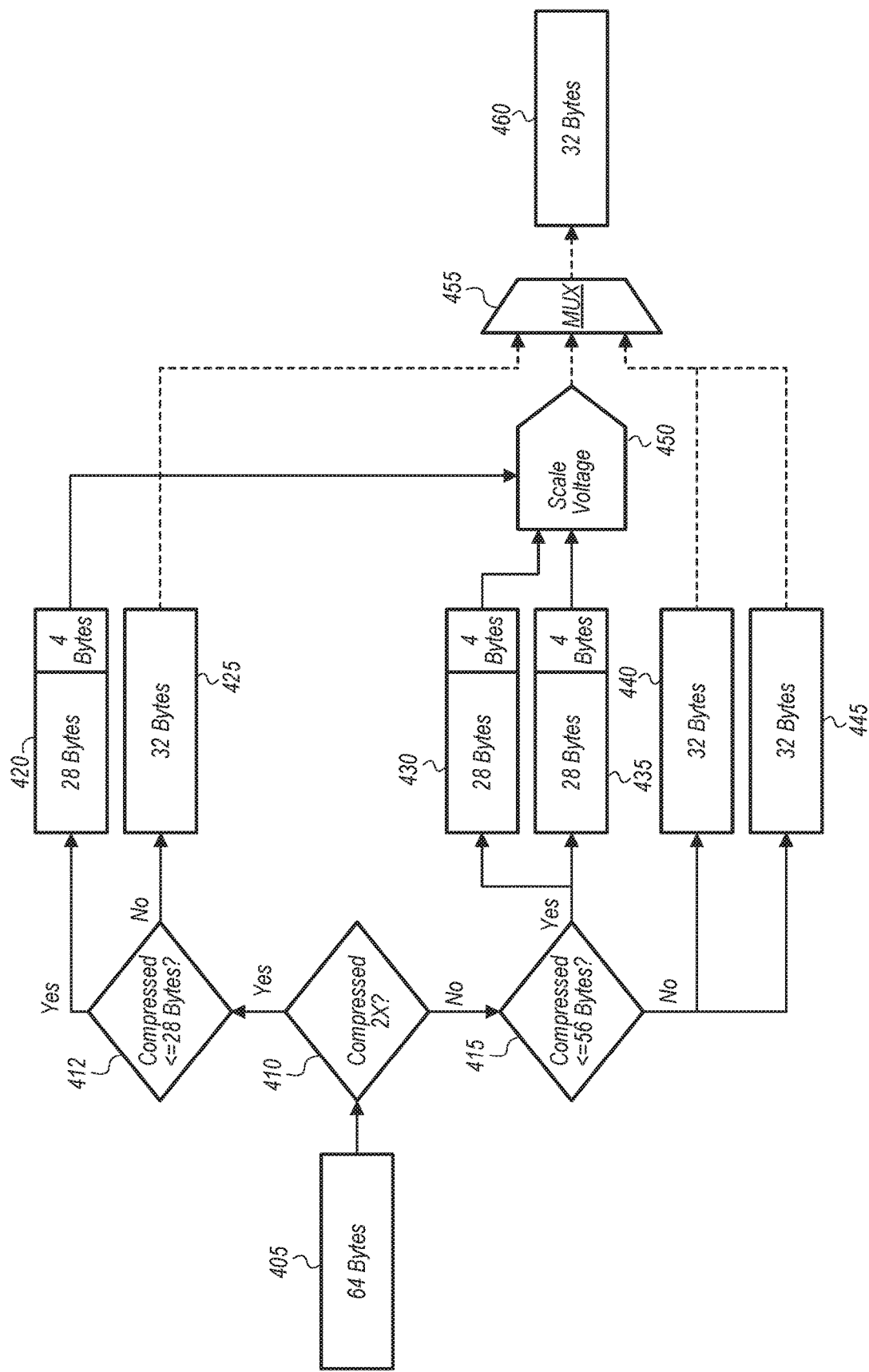
FIG. 4 is a flow diagram illustrating another implementation of preparing a block of data for transfer on a link.

Turning now to FIG. 4, a flow diagram of another implementation of preparing a block of data for transfer on a link is shown. In the implementation shown in FIG. 4, specific values for the input block data size and output link bus width are specified. While these values are shown for one particular implementation, it should be understood that in other implementations, these values can differ. However, similar techniques for determining when and how to compress data and when and how to add ECC bits to the data, with adjustments made based on specific input block data size and output link bus width, can be used in these other implementations to help reduce energy consumption.

In one implementation, input block of data 405 has a size of 64 bytes. Block 405 represents the input block of data which is going to be sent over the link 460 with a bus width of 32 bytes. Therefore, without compression, the original block 405 of 64 bytes could be sent over the link 460 at the non-reduced supply voltage setting in two clock cycles. However, the potential to reduce energy consumption is determined based on the conditional elements shown in the flowchart of FIG. 4. In other implementations, variations in some of the conditional elements can be made depending on differences in the amount of data being sent and the bus width of the link over which the data will be sent.

For example, in one implementation, a control unit (e.g., control unit 225) determines if the block of data 405 is able to be compressed by at least a factor of two (conditional block 410). In other words, the control unit determines if the 64 bytes of block of data 405 can be compressed to less than or equal to 32 bytes. If the block of data 405 is able to be compressed by at least a factor of two (conditional block 410, "yes" leg), then the control unit determines if the block of data is able to be compressed to less than or equal to 28 bytes (conditional block 412). In conditional block 412, the control unit is trying to determine if there is enough savings from compression to add ECC bits to the compressed block of data while still allowing the concatenation of the block and ECC bits to be sent in a single cycle on the link 460. If the block of data 405 is not able to be compressed by at least a factor of two (conditional block 410, "no" leg), then the control unit determines if the block of data 405 is able to be compressed to less than or equal to 56 bytes (conditional block 415).

In conditional block 412, the control unit is trying to determine if there is enough savings from compression to add ECC bits to the compressed block of data even though a cycle cannot be saved. If the block of data is able to be compressed to less than 28 bytes (conditional block 412, "yes" leg), then the control unit adds ECC bits to the compressed data as shown in block 420. Otherwise, if the block of data is unable to be compressed to less than 28 bytes (conditional block 412, "no" leg), then the control unit does not add ECC bits to the compressed data as shown in block 425.

If the block of data 405 is able to be compressed to less than or equal to 56 bytes (conditional block 415, "yes" leg), then the control unit adds ECC bits to the compressed data as shown in blocks 430 and 435. If the block of data 405 is not able to be compressed to less than or equal to 56 bytes (conditional block 415, "no" leg), then the control unit does not compress the data nor does the control unit add ECC bits to the data, with the original block of data 405 sent over the link as 32-byte block 440 in a first cycle and 32-byte block 445 in a second cycle.

In the cases where ECC bytes are added to the data, the voltage on the link is reduced as indicated by scale voltage block 450. When the voltage on the link is reduced, the bit error rate typically increases but the added ECC bytes allow for the bit errors to be corrected. The input paths from the different cases processed by the control unit are coupled to the inputs of mux 455. The output of mux 455 is coupled to link 460. It is noted that the control unit also includes an indication with the block of data when sending the block of data over link 460, with the indication specifying whether ECC bits were added to the block of data. This indication is also referred to as "metadata". Also, metadata is also included in the transferred data to indicate whether compression was used and the type of compression. In one implementation, base delta immediate compression is used to compress the block of data 405 in cases when the control unit decides to compress block of data 405. In other implementations, other types of compression are used.

Figure 5:
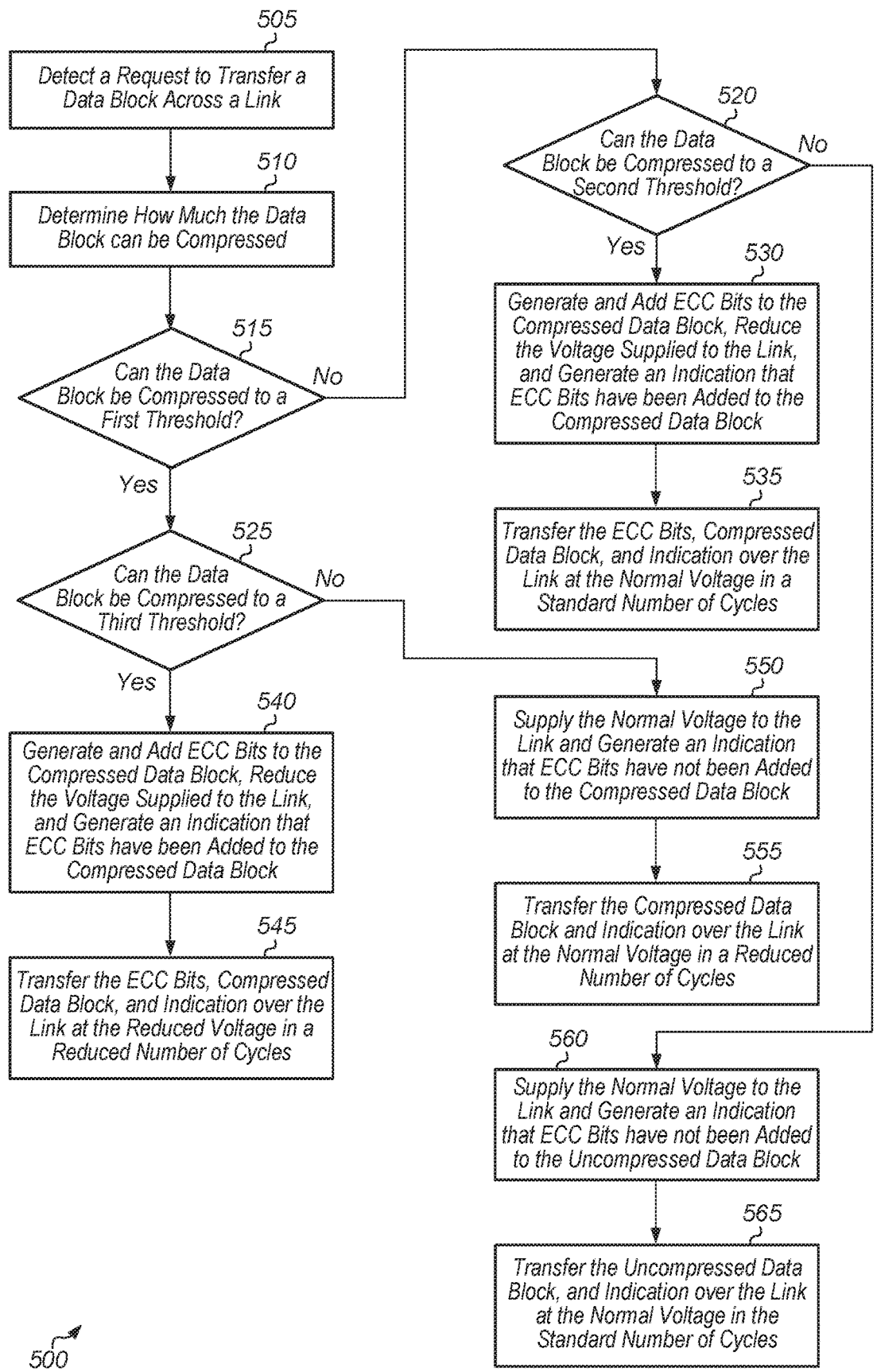
FIG. 5 is a generalized flow diagram illustrating one implementation of a method for implementing reliable voltage scaling for transmitting compressed data.
Figure 6:
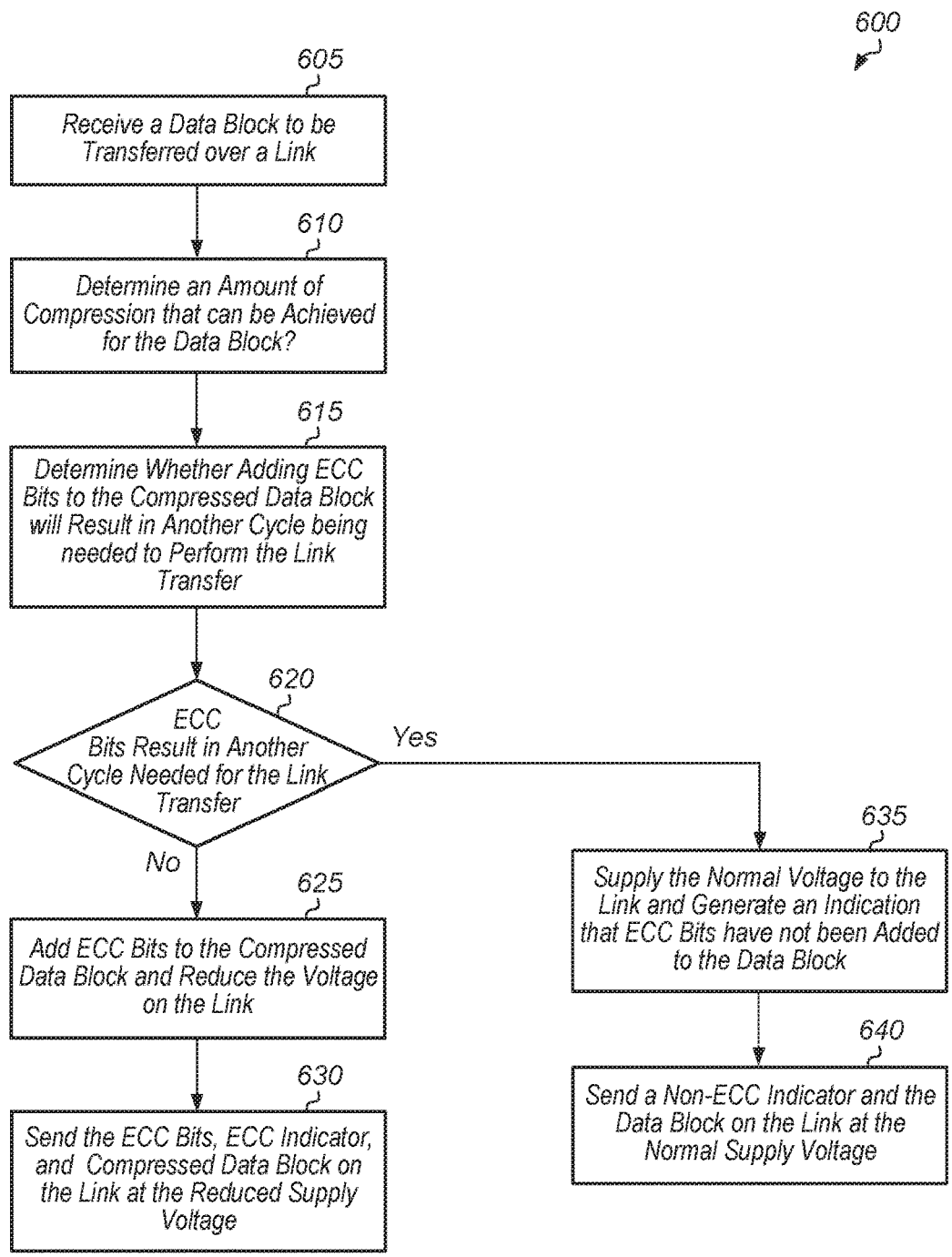
FIG. 6 is a generalized flow diagram illustrating one implementation of a method for reliably sending data over voltage scaled links.

Referring now to FIG. 5, one implementation of a method 500 for implementing reliable voltage scaling for transmitting compressed data is shown. For purposes of discussion, the steps in this implementation and those of FIG. 6 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 500.

A request to transfer a data block across a link is detected by a control unit (e.g., control unit 225 of FIG. 2) (block 505). In one implementation, the data block is a cache line of data being read out of a cache. In other implementations, the data block is retrieved from other types of memory structures. The size of the data block varies according to the implementation. In response to detecting the request, the control unit determines how much the data block can be compressed (block 510). If the data block is unable to be compressed below a first threshold (conditional block 515, "no" leg), then the control unit determines if the data block is able to be compressed to a size less than or equal to a second threshold (conditional block 520). In one implementation, the first threshold is equal to a value which allows the number of cycles used for transferring the data block over the link to be reduced. In one implementation, the second threshold is equal to a value which allows ECC bits to be added to the compressed block such that the combination of the compressed block and ECC bits is less than or equal to the size of the original uncompressed block.

If the data block is able to be compressed to a size less than or equal to the second threshold (conditional block 520, "yes" leg), then the control unit generates and adds ECC bits to the compressed data block, reduces the voltage supplied to the link, and generates an indication that ECC bits have been added to the compressed data block (block 530). Next, the control unit transfers the ECC bits, compressed block, and indication over the link at the normal voltage in the standard number of cycles (block 535). After block 535, method 500 ends. Instead of letting the extra savings from compression go unused, the control unit uses the extra savings from compression to store ECC bits, allowing the compressed data block to be sent over the link while the link is supplied at the reduced voltage. This helps to reduce the amount of power which is consumed when transferring block the data over the link.

If the data block is able to be compressed down to a size less than or equal to the first threshold (conditional block 515, "yes" leg), then the control unit determines if the data block is able to be compressed down to a size less than or equal to a third threshold (conditional block 525). In one implementation, the first threshold is equal to half of the size of the original data block. In this implementation, the third threshold is equal to a value which allows ECC bits to be added to the compressed block without the combination of the compressed block and ECC bits exceeding the first threshold. In other implementations, the first and third thresholds are equal to other values.

If the data block is able to be compressed down to a size less than or equal to the third threshold (conditional block 525, "yes" leg), then the control unit generates and adds ECC bits to the compressed data block, reduces the voltage supplied to the link, and generates an indication that ECC bits have been added to the compressed data block (block 550). Next, the control unit transfers the ECC bits, compressed block, and indication over the link at the reduced voltage in a reduced number of cycles (block 555). After block 555, method 500 ends. Instead of letting the extra savings from compression go unused, the control unit uses the extra savings from compression to store ECC bits, allowing the compressed data block to be sent over the link while the link is supplied at the reduced voltage. This helps to reduce the amount of power which is consumed when transferring the compressed data block over the link. In one implementation, the compressed block includes an indication that the block has been compressed.

If the data block is unable to be compressed to the third threshold (conditional block 525, "no" leg), then the control unit supplies the normal voltage to the link and generates an indication that ECC bits have not been added to the compressed block (block 540). In one implementation, the "normal voltage" is the maximum voltage which can be supplied to the link. Alternatively, in another implementation, the "normal voltage" is the voltage which is supplied to the link for typical transfer operations. Next, the control unit transfers the compressed block and indication over the link at the normal voltage in a reduced number of cycles (block 545). After block 545, method 500 ends. While the control unit was not able to reduce the voltage supplied to the link, the compressed block is able to be sent over the link in a fewer number of cycles since the data block was able to be compressed below the first threshold.

If the data block is unable to be compressed below the second threshold (conditional block 520, "no" leg), then the control unit supplies the normal voltage to the link and generates an indication that ECC bits have not been added to the uncompressed data block (block 560). Next, the control unit transfers the uncompressed data block and indication over the link at the normal voltage in the standard number of cycles (block 565). After block 565, method 500 ends. In this case, the data block is sent over the link without any power savings being achieved.

Turning now to FIG. 6, one implementation of a method 600 for reliably sending data over voltage scaled links is shown. A control unit receives a data block to be transferred over a link (block 605). Next, the control unit determines an amount of compression that can be achieved for the data block (block 610). Also, the control unit determines whether adding ECC bits to the compressed data block will result in another cycle being needed to perform the link transfer (block 615).

If adding ECC bits to the compressed data block will not result in another cycle being needed to perform the link transfer (conditional block 620, "no" leg), then the control unit adds ECC bits to the compressed block and reduces the voltage on the link (block 625). Next, the control unit sends the ECC bits, ECC indicator (to indicate ECC bits were added to the compressed block), and compressed data block on the link at the reduced supply voltage (block 630). After block 630, method 600 ends.

If adding ECC bits with the compressed data block will result in another cycle being needed to perform the link transfer (conditional block 620, "yes" leg), then the control unit does not add ECC bits to the data block and the normal voltage is maintained for the link (block 635). Next, the control unit sends a non-ECC indicator (to indicate ECC bits were not added to the data block) and the data block (compressed or uncompressed depending on the implementation) on the link at the normal supply voltage (block 640). After block 640, method 600 ends.

In various implementations, program instructions of a software application are used to implement the methods and/or mechanisms described herein. For example, program instructions executable by a general or special purpose processor are contemplated. In various implementations, such program instructions are represented by a high level programming language. In other implementations, the program instructions are compiled from a high level programming language to a binary, intermediate, or other form. Alternatively, program instructions are written that describe the behavior or design of hardware. Such program instructions are represented by a high-level programming language, such as C. Alternatively, a hardware design language (HDL) such as Verilog is used. In various implementations, the program instructions are stored on any of a variety of non-transitory computer readable storage mediums. The storage medium is accessible by a computing system during use to provide the program instructions to the computing system for program execution. Generally speaking, such a computing system includes at least one or more memories and one or more processors configured to execute program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system comprising:
a first device comprising a control unit;
a second device; and
a link between the first device and the second device;
wherein the control unit is configured to:
receive an indication that a block of data will be transferred to the second device;
determine if the block of data can be compressed to a size less than or equal to a first threshold;
determine if the block of data can be compressed to a size less than or equal to a second threshold responsive to determining that the block of data cannot be compressed to a size less than or equal to the first threshold;
responsive to determining that the block of data can be compressed to a size less than or equal to the second threshold but not less than or equal to the first threshold:
reduce a voltage supplied to the link;
generate a compressed version of the block of data;
generate error correction code (ECC) data from the compressed version of the block of data; and
transfer the compressed version of the block of data and the ECC data to the second device on the link using a reduced voltage.

2. The system as recited in claim 1, wherein the first threshold is equal to half a size of the block of data prior to being compressed.

3. The system as recited in claim 1, wherein the link has a first bus width, and wherein the first threshold is equal to the first bus width.

4. The system as recited in claim 3, wherein the first bus width is 32 bytes, and wherein the block of data is a cache line.

5. The system as recited in claim 1, wherein the control unit is configured to transfer the compressed version of the block of data without ECC data using a non-reduced voltage to supply the link responsive to determining that the block of data can be compressed to less than or equal to the first threshold but not less than or equal to a third threshold.

6. The system as recited in claim 5, wherein the control unit is configured to transfer the compressed version of the block of data with ECC data using the reduced voltage to supply the link responsive to determining that the block of data can be compressed to less than or equal to the third threshold.

7. The system as recited in claim 1, wherein the control unit is further configured to generate and transfer, on the link, an indication that ECC data has been included with the compressed version of the block of data.

8. A method comprising:
receiving, by a control unit of a first device, an indication that a block of data will be transferred over a link to a second device;
determining if the block of data can be compressed to a size less than or equal to a first threshold;
determining if the block of data can be compressed to a size less than or equal to a second threshold responsive to determining that the block of data cannot be compressed to a size less than or equal to the first threshold;
responsive to determining that the block of data can be compressed to a size less than or equal to the second threshold but not less than or equal to the first threshold:
reducing a voltage supplied to the link;
generating a compressed version of the block of data;
generating error correction code (ECC) data from the compressed version of the block of data; and
transferring the compressed version of the block of data and the ECC data to the second device on the link using a reduced voltage.

9. The method as recited in claim 8, wherein the first threshold is equal to half a size of the block of data prior to being compressed.

10. The method as recited in claim 8, wherein the link has a first bus width, and wherein the first threshold is equal to the first bus width.

11. The method as recited in claim 8, wherein the first bus width is 32 bytes, and wherein the block of data is a cache line.

12. The method as recited in claim 8, further comprising transferring the compressed version of the block of data without ECC data using a non-reduced voltage to supply the link responsive to determining that the block of data can be compressed to less than or equal to the first threshold but not less than or equal to a third threshold.

13. The method as recited in claim 12, further comprising transferring the compressed version of the block of data with ECC data using the reduced voltage to supply the link responsive to determining that the block of data can be compressed to less than or equal to the third threshold.

14. The method as recited in claim 8, further comprising generating and transferring, on the link, an indication that ECC data has been included with the compressed version of the block of data.

15. An apparatus comprising:
a first device comprising a control unit; and
a communication link;
wherein the control unit is configured to:
receive an indication that a block of data will be transferred on the communication link;
determine if the block of data can be compressed to a size less than or equal to a first threshold;
determine if the block of data can be compressed to a size less than or equal to a second threshold responsive to determining that the block of data cannot be compressed to a size less than or equal to the first threshold;
responsive to determining that the block of data can be compressed to a size less than or equal to the second threshold but not less than or equal to the first threshold:
reduce a voltage supplied to the link;
generate a compressed version of the block of data;
generate error correction code (ECC) data from the compressed version of the block of data; and
transfer the compressed version of the block of data and the ECC data on the communication link using a reduced voltage.

16. The apparatus as recited in claim 15, wherein the first threshold is equal to half a size of the block of data prior to being compressed.

17. The apparatus as recited in claim 15, wherein the communication link has a first bus width, and wherein the first threshold is equal to the first bus width.

18. The apparatus as recited in claim 17, wherein the first bus width is 32 bytes, and wherein the block of data is a cache line.

19. The apparatus as recited in claim 15, wherein the control unit is configured to transfer the compressed version of the block of data without ECC data using a non-reduced voltage to supply the communication link responsive to determining that the block of data can be compressed to less than or equal to the first threshold but not less than or equal to a third threshold.

20. The apparatus as recited in claim 19, wherein the control unit is configured to transfer the compressed version of the block of data with ECC data using the reduced voltage to supply the communication link responsive to determining that the block of data can be compressed to less than or equal to the third threshold.

* * * * *